United States Patent [19]

Kenney

[11] Patent Number: 4,914,740
[45] Date of Patent: Apr. 3, 1990

[54] CHARGE AMPLIFYING TRENCH MEMORY CELL

[75] Inventor: Donald M. Kenney, Shelburne, Vt.

[73] Assignee: International Business Corporation, Armonk, N.Y.

[21] Appl. No.: 164,764

[22] Filed: Mar. 7, 1988

[51] Int. Cl.[4] .................... H01L 29/78; H01L 29/06; H01L 27/02

[52] U.S. Cl. ..................................... 357/236; 357/55; 357/41

[58] Field of Search .................... 357/23.6, 90

[56] References Cited

U.S. PATENT DOCUMENTS

| | | | |
|---|---|---|---|
| 3,385,729 | 5/1968 | Larchian | 357/54 |
| 3,513,365 | 6/1968 | Levi | 307/251 |
| 3,582,909 | 6/1971 | Booher | 307/238 |
| 3,614,749 | 10/1971 | Radcliffe, Jr. | 307/238 |
| 3,634,825 | 1/1972 | Levi | 307/251 |
| 3,691,537 | 9/1972 | Burgess et al. | 307/238 |
| 3,699,539 | 10/1972 | Spence | 307/238 |
| 3,701,980 | 10/1972 | Mundy | 307/238 |
| 3,706,891 | 12/1972 | Donofrio et al. | 307/238 |
| 3,878,404 | 4/1975 | Walther | 307/238 |
| 3,882,472 | 5/1975 | Smith | 340/173 |
| 4,021,788 | 5/1977 | Marr | 307/238 |
| 4,168,536 | 9/1979 | Joshi et al. | 365/149 |
| 4,462,040 | 7/1984 | Ho et al. | 357/41 |
| 4,467,450 | 8/1984 | Kuo | 365/149 |
| 4,511,911 | 4/1985 | Kenney | 357/23.6 |
| 4,547,793 | 10/1985 | Bergeron | 357/50 |
| 4,549,927 | 10/1985 | Goth et al. | 29/576 |
| 4,561,172 | 12/1985 | Slawinski et al. | 29/576 |
| 4,761,384 | 8/1988 | Neppl et al. | 357/90 |
| 4,763,181 | 8/1988 | Tasch, Jr. | 357/23.6 |

FOREIGN PATENT DOCUMENTS

| 177066 | 4/1986 | European Pat. Off. | 357/23.6 |
|---|---|---|---|
| 090395 | 5/1986 | Japan | 357/23.6 |

OTHER PUBLICATIONS

D. M. Kenney, "Self-Aligned U-Groove Gates . . . ", IBM Technical Disclosure Bulletin, vol. 22, No. 10, 1980, pp. 4448–4449.

K. Terada et al., "A New VLSI Memory Cell Using Capacitance Coupling (CC Cell)", IEEE Trans. Electron Devices, vol. EO-31, No. 9, 1984, pp. 1319–1324.

Leiss et al., "dRAM Design Using the Taper-Isolate Dynamic RAM Cell", IEEE Transactions on Electron Devices, vol. ED-29, No. 4, 1982, pp. 707–714.

Terada et al., "A New VLSI Memory Cell Using MOS Technology (DMOS Cell)", IEEE Transactions on Electron Devices, vol. ED-39, No. 8, 1982, pp. 1301–1308.

Eldin et al., "A Novel JCMOS Dynamic RAM Cell for VLSI Memories", IEEE Journal of Solid-State Circuits, vol. SC-20, No. 3, 1985, pp. 715–723.

(List continued on next page.)

Primary Examiner—Rolf Hille
Assistant Examiner—Robert P. Limanek
Attorney, Agent, or Firm—Sughrue, Mion, Zinn, Macpeak & Seas

[57] ABSTRACT

A charge amplifying memory cell and its memory of making based on trench technology. A trench is formed which reaches through an n-type well region to a p+-type substrate. A triple layer is formed on two sidewalls of the trench consisting of two capacitive insulating layers and a intermediate p+ polysilicon layer. The trench is then at least partially filled with a conductor, such as polysilicon, facing the triple layer. Thereby, the intermediate polysilicon layer acts as a charge storage node with capacitance to both the substrate and the polysilicon filling the trench. The insulating layer facing the well is opened with a contact hole near its top so that a p+ transistor drain is formed in the adjacent well by diffusion from the polysilicon through the contact hole. A p+ transistor source is doped into the well with a gate region between it and the drain to provide a write transistor. A p+ region is also formed adjacent a sidewall of the trench other than the one containing the contact hole so that a read transistor is vertically formed in the n-type well between it and the substrate. The intermediate p+ polysilicon layer acts as the electrode of this read transistor, whereby stored charge is amplified by the read transistor.

8 Claims, 6 Drawing Sheets

OTHER PUBLICATIONS

Terada et al., "Advanced DMOS Memory Cell Using a New Isolation Structure", IEEE Transactions on Electron Devices, vol. ED-31, No. 9, 1984, pp. 1308-1313.

Jambotkar, "Compact One-Device Dynamic RAM Cell with High Storage Capacitance", IBM Technical Disclosure Bulletin, vol. 27, No. 2, 1984, pp. 1313-1320.

Kenney, "V-Groove Dynamic Memory Cell", IBM Technical Disclosure Bulletin, vol. 23, No. 3, 1980, pp. 967-969.

Mashiko et al., "A 4-Orbit DRAM with Folded-Bit-Line . . . ", IEEE Journal of Solid-State Circuits, vol. SC-22, No. 5, 1987, pp. 643-650.

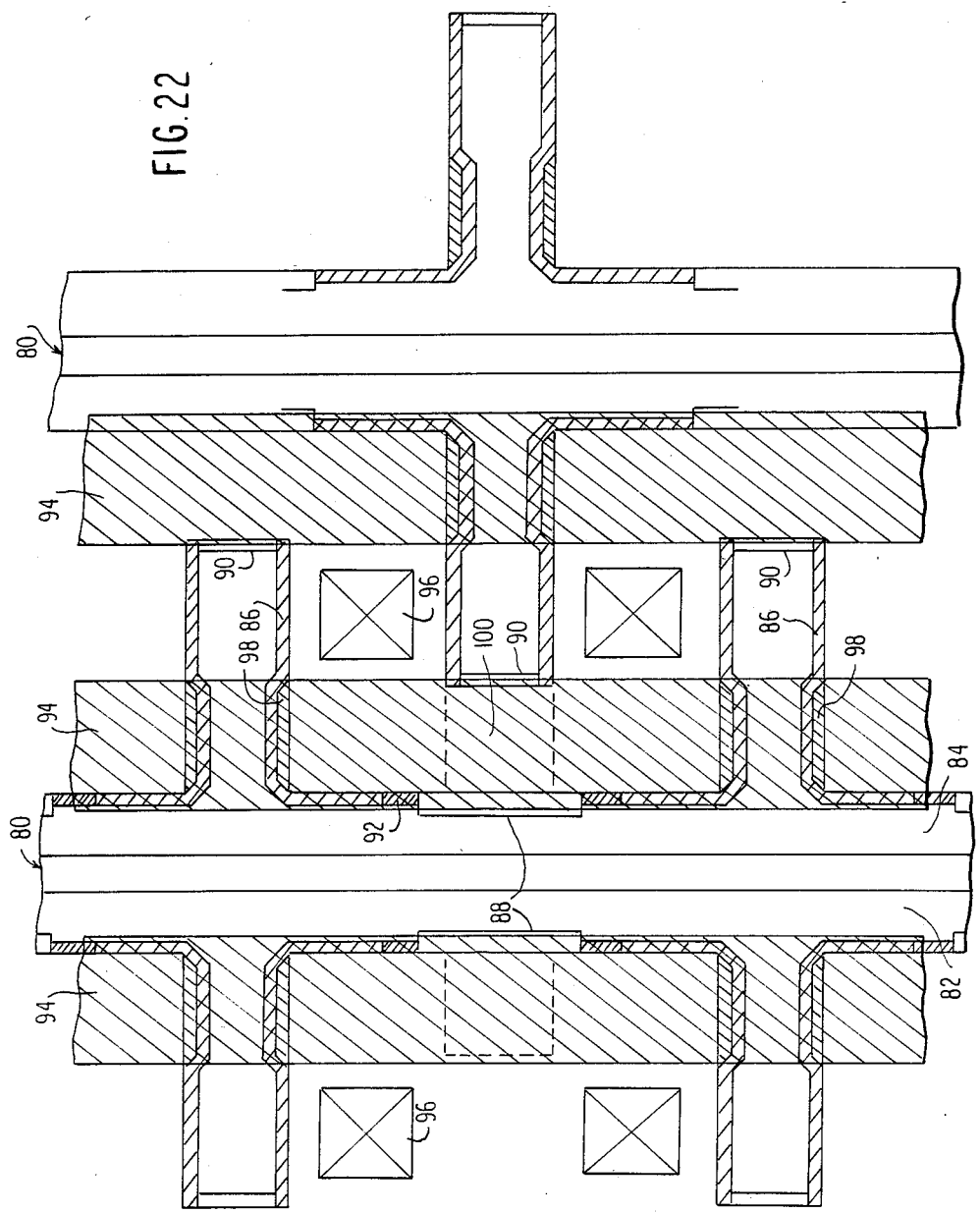

CHARGE AMPLIFYING TRENCH MEMORY CELL

BACKGROUND OF THE INVENTION

1. Field of the Invention

The invention relates generally to semiconductor memories. In particular, the invention relates to a charge amplifying cell built in a trench.

2. Background Art

Dynamic memory cells have become the most common type of inexpensive semiconductor memory. Their operation relies upon the selective storage of a charge on a cell node (capacitance) and the later reading of the quantity of this charge to determine the stored data value. As fabrication techniques have become increasingly sophisticated, the size of the storage cell has decreased and therefore, for the most part, the size of the stored charge has also decreased. However, it has become increasingly difficult to read the very small stored charges. During the reading operation, the stored charge is usually distributed over the bit line connecting the storage node to the sense amplifier so that the resultant voltage can become very small. Also, there is inevitably some noise present on the integrated circuit which can mask the small voltage variations produced by the stored charge.

One solution has been the charge amplifying cell, such as disclosed by Joshi et al. in U.S. Pat. No. 4,168,536. In such a cell, a charge is selectively gated onto a storage node or capacitor by a write transistor. Thereafter, the write transistor is switched off and the amount of stored charge becomes the stored data value. One of the sides of the capacitor is coupled to the gate of a read transistor. By various techniques, when it is desired to read the stored data value, a current passing through the read transistor (determined by its conductance and thus the amount of stored charge) is measured. The measurement can involve the passage of a substantial current through the read transistor. The important point is that the charge on the storage node only controls the read transistor, is not directly detected and is not directly affected by the reading current. That is, the stored charge is amplified by the reading transistor. Therefore, a relatively small storage charge on a relatively small capacitor can cause a large current to be read.

As the number of elements on a dynamic semiconductor memory chip has increased, one of the techniques used to provide a relatively large storage capacitance using a relatively small chip area has used trench technology. In this techniques, a relatively deep trench with vertical sidewalls are formed in the substrate. Then a capacitor is formed on one or more of the vertical sidewalls. Thereby, the top surface area of the chip occupied by the capacitor can be much less than the area of the capacitor itself. There are many examples of such dRAM (dynamic random access memory) trench cells, such as Mashiko et al., "A 4-Mbit DRAM with Folded-Bit-Line Adaptive Sidewall-Isolated Capacitor (FASIC) Cell", appearing in IEEE Journal of Solid-State Circuits, vol. SC-22, no. 5, October 1987, pages 643–649. Another, example is U.S. Pat. No. 4,785,337, issued November 1988, by the present inventor and entitled "Dynamic RAM Cell Having Shared Trench Storage Capacitor with Sidewall-Defined Bridge Contacts and Gate Electrodes". This last reference is incorporated herein by reference because of its full description of trench technology.

The proposals to date for charge amplifying dRAM cells have resulted in layouts which are much larger than the conventional dRAM cells or utilize an operating principle which is undeveloped or marginal.

SUMMARY OF THE INVENTION

Accordingly, an object of the invention is to provide a memory cell of the charge amplifying type.

Another object of the invention is to provide a dynamic memory cell having the density allowed by trench technology.

A further object of the invention is to provide a memory cell using well known physical processes.

The invention can be summarized as a charge amplifying cell built according to trench technology in which a trench is formed in a substrate and extends down to a high conductivity region. There are formed successive layers of an insulator, polysilicon and an insulator within the trench. Then polysilicon fills at least part of the remainder of the trench. The middle polysilicon layer acts as a storage node with capacitance both to the high conductivity region and to the bulk polysilicon in the trench. The polysilicon layer on the two sidewalls acts as gate electrodes to two vertical transistors using the less highly doped substrate as a channel to the highly conductive region. One of the transistors is always off while the other is the read transistor controlled by the voltage on the storage node. A planar write transistor is formed at the surface to gate in charge to the storage node. The polysilicon filling the trench is used as the read word line.

BRIEF DESCRIPTION OF THE DRAWINGS

FIG. 22 is a plan view showing a second embodiment of the invention.

DETAILED DESCRIPTION OF THE PREFERRED EMBODIMENTS

Figure 1:
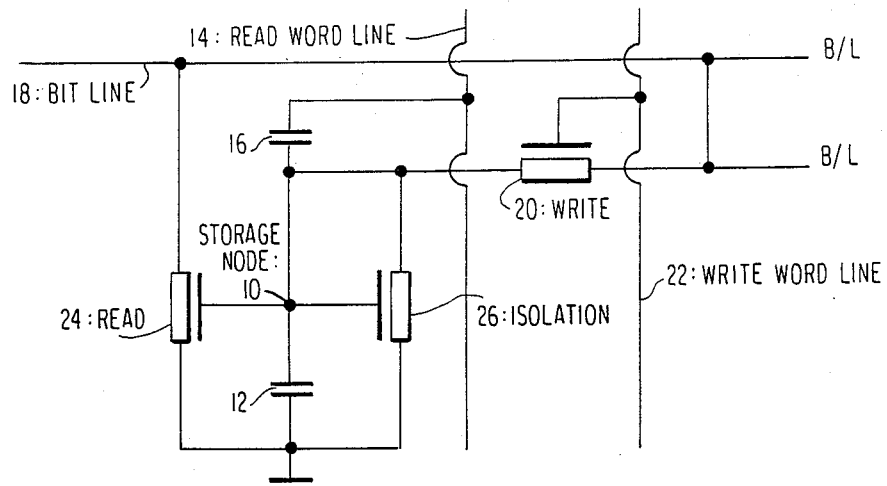
FIG. 1 is an electrical representation of the charge amplifying memory cell of the present invention.

The present invention intends to use fairly conventional trench technology to form a charge amplifying cell. The electrical representation of the cell is illustrated in FIG. 1. Charge representing the data value is impressed on a storage node 10 which is coupled to a highly conductive grounded substrate by an inner capacitance 12 and is also coupled to a read word line 14 by an outer capacitance 16. The meaning of inner and outer capacitance will become obvious later. The read word line 14 is usually held at a high potential $V_H$ so that the total capacitance of the storage node is the sum of the inner and outer capacitances 12 and 16. A bit line 18 is used as a charge signal line both for impressing the stored charge on the storage node 10 and for reading the stored charge therefrom. A write transistor 20, gated by a write word line 22 gates the bit line 18 to the storage node 10 for impressing the charge onto the storage node 10.

The charge on the storage node 10 controls the conductivity of a read transistor 24 and an isolation transistor 26. The read transistor 24 has a channel extending from the read word line 18 to the highly conductive substrate. The isolation transistor 26 has a channel extending from the storage node 10 to the highly conductive substrate. However, the circuit is designed such that the isolation transistor 26 is never turned on.

In particular, the read transistor 24 and the isolation transistor 26 are p-channel MOS transistors having threshold voltages of approximately $V_T = -3V$. On the other hand, the write transistor 20 is a p-channel MOS transistor having a threshold voltage of approximately $V_T = -1V$. The operation of the illustrated storage cell is summarized in Table 1.

TABLE 1

| Operation | Read W/L | Write W/L | Bit Line | Node |
|---|---|---|---|---|
| Write | $V_H$ | 0 | $V_H$ or 0 | $V_H$ or 1 |
| Standby | $V_H$ | $V_H$ | $V_H$ | $V_H$ or 1 |
| Read | 0 | $V_H$ | $V_H$ | $V_H$-$V_S$ or 1-$V_S$ |

During a write operation into the storage node 10, the read word line 14 is brought up to $V_H$ (which is about 3.3 V in current technology). The write word line 22 is brought low to 0 V and a high or low voltage of $V_H$ or 0 V is impressed on the bit line 18, which results in a voltage on the storage node 10 of $V_H$ or 1 V, dependent upon the data. In the standby mode, most of the time for a dynamic memory cell, the write transistor 20 is turned off because the write word line 22 is brought high to $V_H$. During the standby mode, the voltage on the read word line 14 is kept at $V_H$ so that the voltage at the node 10 is maintained at $V_H$ or 1 V, dependent upon the data.

For a read operation, the read word line 14 is brought down to 0 V. This swing of the read word line 14 from $V_H$ to 0 V causes a voltage swing $V_S$ at the storage node 10 of about 2 V regardless of the voltage previously impressed thereupon.

Figure 2:
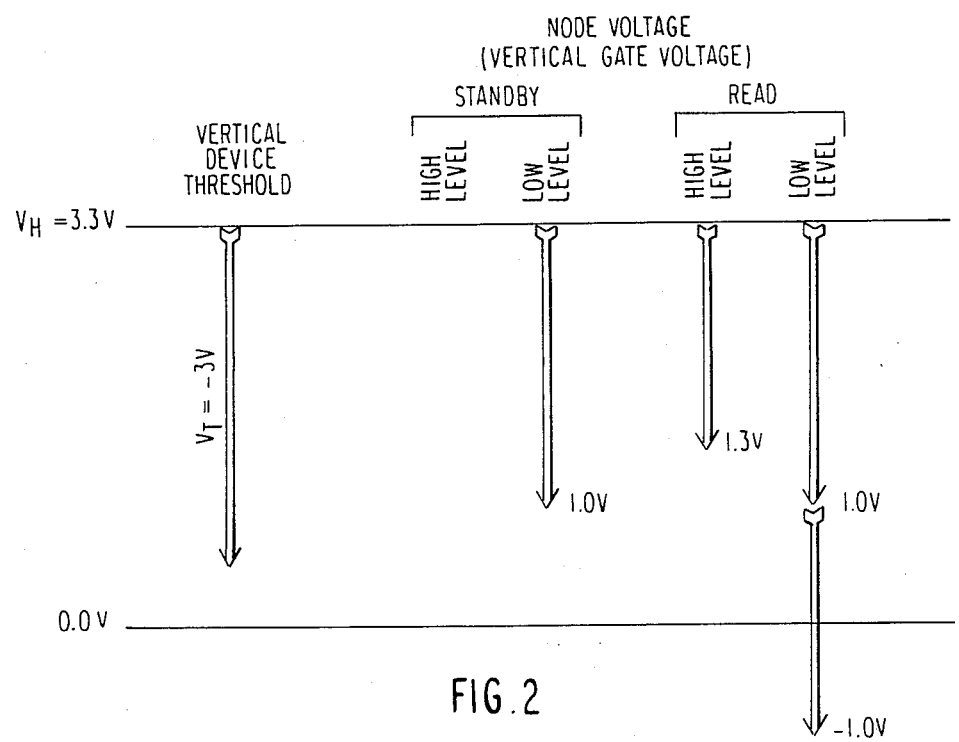
FIG. 2 is a signal chart showing the voltages developed in the memory cell of FIG. 1 for different memory levels and at different times.

The operation of the gain cell is illustrated in FIG. 2. It is important that the threshold voltage $V_T$ for the p-channel read transistor 24 and for the isolation transistor 26 be relatively large in the negative direction, preferably about $-3$ V. The node voltage gated through the write transistor 20 having a voltage threshold of about 1 V is then either 3.3 V or 1.0 V, depending on the data value. This node voltage $V_H$ is held during the standby mode. Neither of these voltages are sufficient to turn on the read transistor 24 so that the charge continues to be stored on the node 10. For a read operation, the read word line 14 is brought from $V_H$ to 0 V. This reduces the voltage on the node 10 to either 1.3 V or $-1.0$ V. The 1.3 V for the high level stored signal is insufficient to turn on the read transistor 24 but the $-1.0$ V for the low level stored signal does turn on the read transistor 24 so that a fairly substantial current can be measured in a sense amplifier connected to the bit line 18.

The isolation transistor 26 has its source (upper current electrode in FIG. 1) connected to its gate at all times. As a result, it never turns on. When low data of 1 V is stored on the storage node 10, the voltage swing $V_S$ for reading causes the voltage on the storage node 10 to assume a negative value. As a result, the upper current electrode for the isolation transistor 26 is converted from a source to a drain relative to ground on the other current electrode. However, this negative value is still above the relatively large negative threshold voltage $V_T$ so that the isolation transistor 26 remains off. The isolation transistor 26 is an artifact of the trench technology but its presence presents no operational difficulties.

Figure 3:
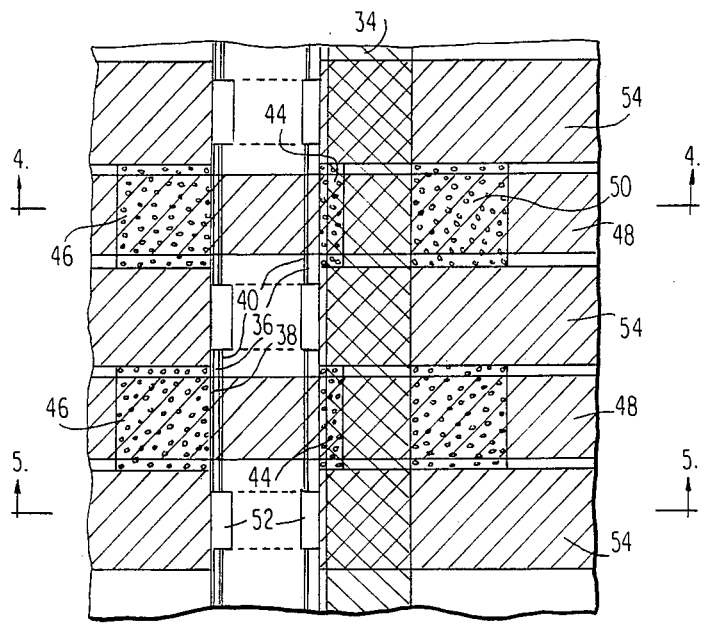
FIG. 3 is a plan view of an integrated circuit using a first embodiment of the invention.
Figure 4:
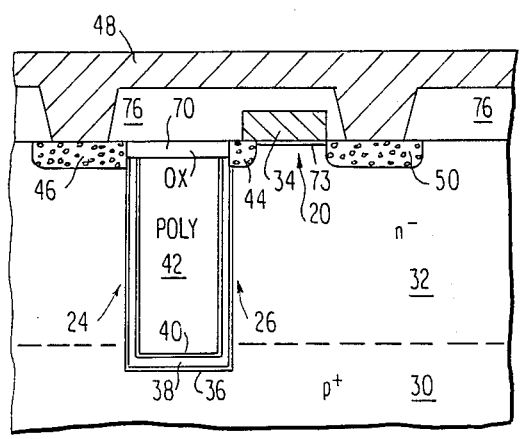
FIG. 4 is a cross sectional view in the active area of the device of FIG. 3.
Figure 5:
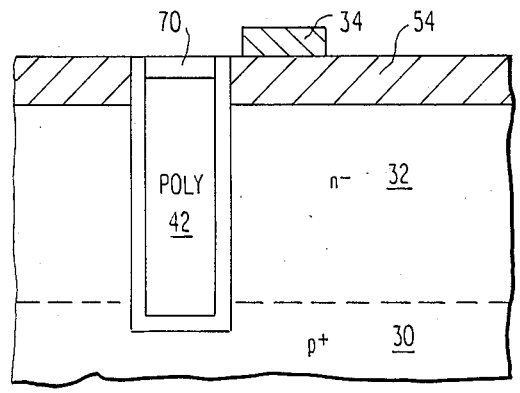
FIG. 5 is a cross sectional view in the isolation area of the device of FIG. 3.

The memory cell of FIG. 1 can be achieved in trench technology by the structure illustrated in plan view in FIG. 3 and in cross sectional views in FIGS. 4 and 5. The method of achieving this structure will be described later. As best shown in FIG. 4, the cell is built on a p+ substrate 30 having a retrograde doped n⁻ well 32. By retrograde doping is meant that the doping density at the surface is less than at deeper areas of the n⁻ well 32. The write transistor 20 is a planar transistor formed below a polysilicon electrode 34, which is the write word line 22. A trench is formed in the n⁻ well 32 of the semiconductor and extends down into the p+ substrate 30. In the trench are successively formed an outer dielectric layer 36, a polysilicon layer 38 and an inner dielectric layer 40. The remainder of the trench is then filled with polysilicon 42. The polysilicon layer 38 acts as the voltage node 10. The outer dielectric layer 36 acts as a gate oxide for the read transistor 24 and the isolation transistor 26 which operate vertically in the n⁻ well 32 and also acts as insulator of the capacitor 12, primarily between the polysilicon layer 38 and the p+ substrate 30. The polysilicon 42 in the trench acts as the read word line 14 and the inner dielectric layer 40 acts as the insulator of the capacitor 16. A p+ surface region 44 acts as the drain of the planar write transistor 20 and as the source of the vertical isolation transistor 26 and is also connected through the outer dielectric layer 36 to the polysilicon layer 38. Another p+ surface region 46 contacts a metal bit line 48 and acts as the source of the vertical read transistor 24. The p+ substrate 30 acts as the drain for both of the vertical transistors 24 and 26. Yet another p+ surface region 50 contacts the metal bit line 48 and acts as the source for the planar write transistor 20.

In the isolation areas of the trench between memory cells, as illustrated in FIG. 5, the polysilicon 42 in the trench is separated from the bulk n⁻ and p+ regions 32 and 30 by a relatively thick isolation oxide 52. The surfaces of adjacent memory cells of FIG. 4 are separated by a thick surface oxide 54 in the isolation area.

The integrated circuit of FIG. 3 clearly shows the array in the vertical direction. Additional parallel trenches are formed to produce the array in the horizontal direction. In fact, the p+ surface regions 46 and 50 can be used as contacts for neighboring trenches. That is, mirror images of the illustrated integrated circuit are formed about lines passing vertically through the middle of the p+ surface regions 46 and 50. As a result, it is seen that the gain memory cell can be built in an area of 2 features by 3 features.

Figure 6:
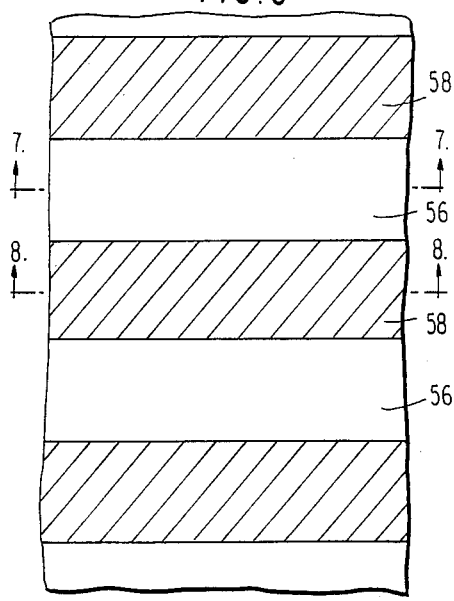
FIGS. 6, 9, 12, 16 and 19 are plan views, corresponding to FIG. 3, of the circuit of the first embodiment at various times during its fabrication.
Figure 7:
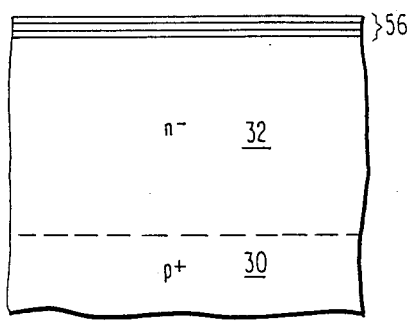
FIGS. 7, 10, 13, 17 and 20 are cross sectional views, corresponding to FIG. 3, at times during fabrication corresponding respectively to FIGS. 6, 9, 12, 16 and 19.
Figure 8:
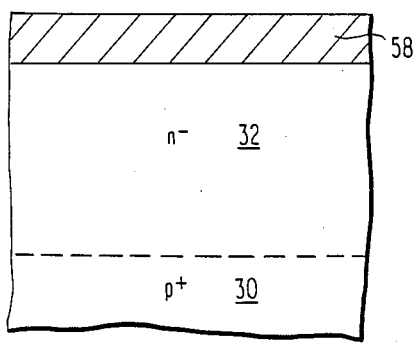
FIGS. 8, 11, 14, 18 and 21 are cross sectional views, corresponding to FIG. 4, at times during fabrication corresponding respectively to FIGS. 6, 9, 12, 16 and 19.

The fabrication process which results in the structure of FIGS. 3-5 will now be described. Referring first to FIGS. 6, 7 and 8, the n⁻ well 32 is formed in the p⁺ substrate of silicon by retrograde doping. The n⁻ well 30 extends over a large number of memory cells but peripheral circuits may be built outside the area of the n⁻ well 32. In the retrograde doping, the n-type doping concentration is about three times larger at the bottom of the n⁻ well 30 than at its top. This retrograde doping may be accomplished by ion implantation of a single species but at different energies. A high fluence of high energy ions produces a heavy deep concentration while a lesser fluence of lower energy ions produces a lighter concentration nearer the surface. This type of doping gradient causes a larger threshold voltage $V_T$ for the deeper read and isolation transistors 24 and 26 than for the shallow write transistor 20. The n⁻ well 30 is formed to a depth of about 1.5 micrometers. Then, a photolithographic mask is patterned and an ox/nitride/ox mask 56 is formed having regular stripes. The ox/nitride/ox mask 56 is formed by thermally oxidizing the exposed silicon n⁻ well 32 at 900° under either wet or dry conditions to form the bottom oxide to a thickness of 20 nm. A 100 nm thick nitride layer is formed by CVD (chemical vapor deposition) using silane and NH₃. The upper oxide layer of 100 nm thickness is formed by well known oxide CVD techniques. Thereafter, the photolithographic mask is removed and ROX stripes 58 are formed by thermally oxidizing the portions of the n⁻ well 32 not covered by the ox/nitride/ox mask 56 to produce silicon oxide. This oxidizing steps also serves to activate the dopants in the n⁻ well 32.

Figure 9:
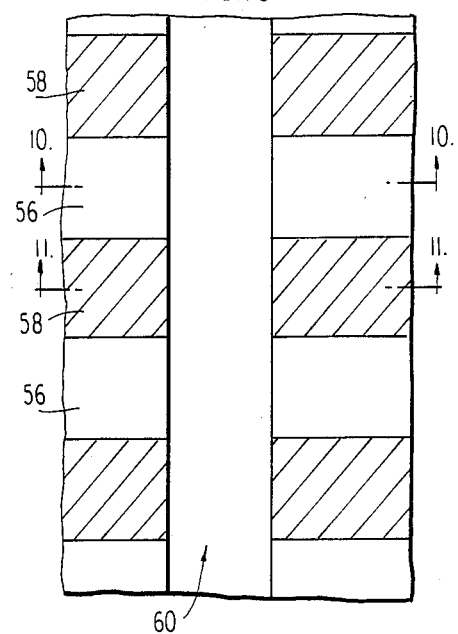
Figure 10:
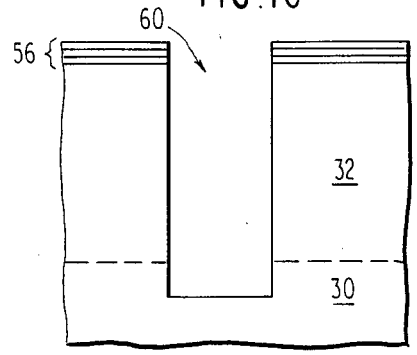
Figure 11:
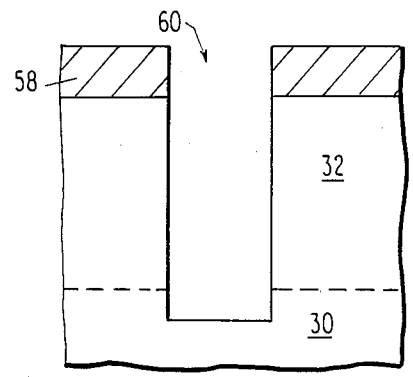

A trench 60 is formed, as illustrated in FIGS. 9, 10 and 11, by patterning with a photolithographic mask to leave uncovered the area of the trench 60. Then RIE (reactive ion etching) is performed. The RIE conditions are changed during the etching to account for changing from etching the ox/nitride/ox mask 56 and ROX stripes 58 to etching the underlying silicon. The RIE etching is continued to a trench depth of about 2.0 micrometers so that the trench 60 extends down to the p⁺ substrate 30.

Figure 12:
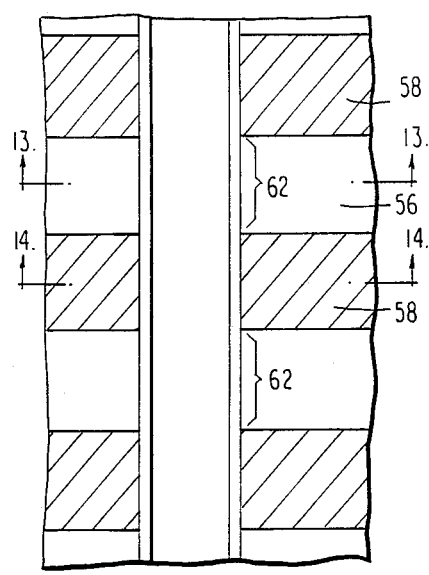
Figure 13:
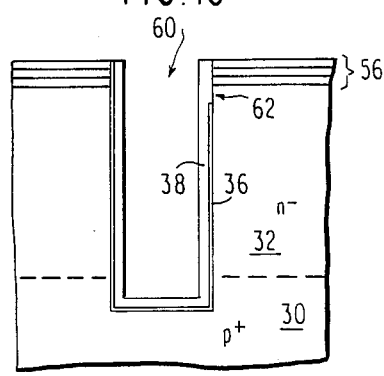
Figure 14:
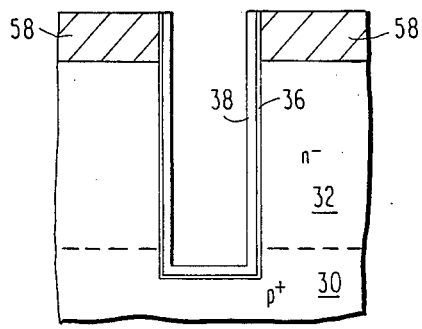

Then, as illustrated in FIGS. 12-14, the outer insulating layer 36 is formed in the trench 60. Preferably, the outer insulating layer 36 is an ox/nitride/ox layer, with two layers of silicon dioxide separated by a layer of silicon nitride. Each of the three layers is about 4 nm thick. The inner silicon dioxide layer can be thermally oxidized and the overlying silicon nitride layer is a CVD nitride layer. The outer silicon dioxide layer can be thermally oxidized from silicon nitride. The oxidation of silicon nitride is relatively slow but the desired layer is relatively thin. It is not necessary to pattern the formation of the outer insulating layer 36 since portions outside the trench will be removed eventually.

Figure 15:
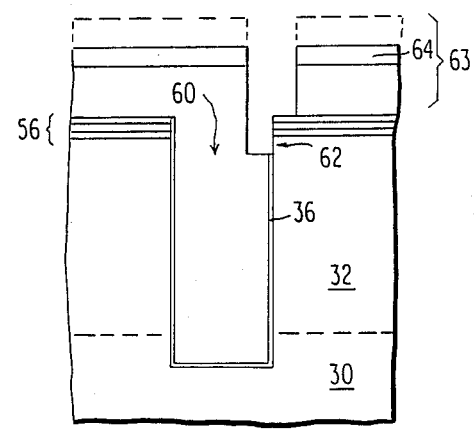
FIG. 15 is a cross sectional view showing the method of forming a buried contact.

At this time, a buried contact hole 62 is formed in the outer insulating layer 36 in a region extending about 0.3 micrometers below the top surface of the trench 60 at its right hand side and generally below the ox/nitride/ox mask 56. This localized patterning on the side wall of the trench can be accomplished as illustrated in FIG. 15. A multi-level photoresist 63 is applied to the top of the ox/nitride/ox mask 56 overlying the n⁻ well 32 and is planarized so as to fill the trench 60. The photoresist 63 includes outer erodible layers and a central non-erodible level 64 which is resistive to plasma etching or RIE. The photoresist 63 is optically patterned and developed to provide an opening in the top erodible layer at the upper right corner of the trench 60 in the area of the ox/nitride/ox mask 56. The exposed non-erodible layer 64 is then etched through. Thereafter, RIE is performed which removes the top erodible layer of the photoresist 63 and the underlying erodible layer. The duration of the RIE is carefully controlled so that it removes the photoresist 63 to about 0.3 micrometers below the planar bottom surface portion of the ox/nitride/ox mask 56. Then, a dry plasma etch will etch away the outer insulating layer 36 exposed in the trench 60 to form the buried contact hole 62 but will be stopped in other areas by the non-erodible layer 64.

After the plasma etching, the photoresist 63 s removed. Thereby, the n⁻ well 32 is exposed through the outer insulating layer 36 into the trench 60.

In the next step, also illustrated in FIGS. 12-14, a layer of p⁺-type polysilicon 38 is deposited so that it forms a thickness of about 50 nm over all surfaces in the trench 60. Note that the so deposited polysilicon layer 38 directly contacts the n⁻ well 32 through the buried contact hole 62. This contact is not only electrical but also provides a source of p-type dopants for the n⁻ well 32 from the p⁺-type polysilicon 38. It is unnecessary to pattern this deposition which may be performed by CVD. Instead, a chemical-mechanical polishing of the surface is performed using a chemical which preferentially attacks polysilicon. However, the polysilicon 38 in the trench 60 is not attacked since it is not subject to the mechanical polishing. At this stage, the upper layer of silicon dioxide and the silicon nitride layer deposited in forming the outer insulating layer 36 can be removed from the surface by sequentially etching with dilute hydroflouric acid to dissolve exposed silicon oxide and with phosphoric acid at 150° C. to dissolve exposed silicon nitride. Neither of these acids will attack polysilicon.

Figure 16:
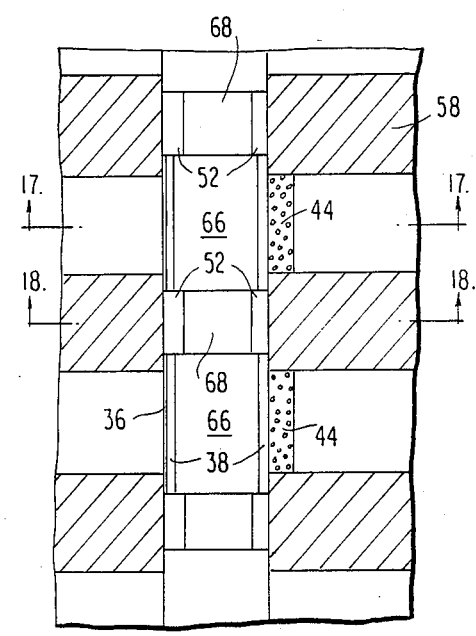
Figure 17:
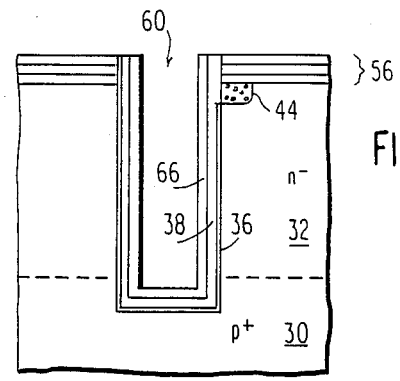
Figure 18:
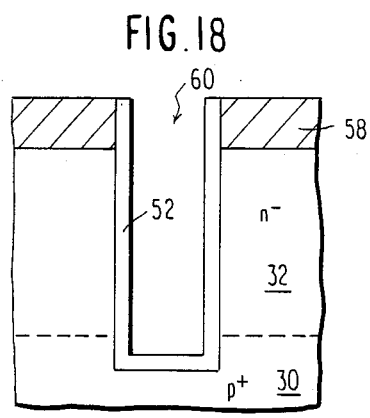

Up to this point, there has been no patterning within the trench, with the exception of the buried contact 62. The following steps are performed, as illustrated in FIGS. 16, 17 and 18, to remove the polysilicon layer 38 in the trench 60 in the isolation section of FIG. 18. First, a 20 nm silicon nitride layer 66 is uniformly deposited by CVD. A multi-level photoresist is deposited and fills the trench 60. It is optically patterned and developed to expose the non-erodible layer in areas overlying the isolation regions 68. The non-erodible layer of the photoresist is etched and then an oxygen RIE is performed which preferentially attacks exposed erodible photoresist has relatively little effect on exposed silicon oxide or on the non-erodible layer. The RIE removes the erodible photoresist above the non-erodible layer and removes the exposed lower erodible layer to a desired depth dependent on the duration of the RIE. Thereby, the patterned photoresist is removed from the trench in the area of the isolation regions 68. Thereafter, a non-directional plasma etch is used to remove exposed silicon nitride, even on the side walls of the trench in the area of the isolation regions 68. The polysilicon layer 38 in the area of the isolation regions 68 is thereby exposed with the removal of the nitride layer 66. Thereafter, a thermal oxidizing step oxidizes all exposed portions of the polysilicon layer 38 to convert it to the silicon oxide isolation oxide layer 52 in the isolation section to a thickness of about 100 nm. However, the polysilicon layer 38 in the area of the memory cell (FIG. 17) is not exposed and thus remains unconverted. However, the thermal treatment also serves to drive p-type dopants from the p⁺-polysilicon layer 38 through the buried contact hole 62 to form the p⁺ buried contact 44. The nitride layer 66 remaining in the active area (FIG. 17) of the trench 60 is then removed by immersion in phosphoric acid at 150° C.

Figure 20:
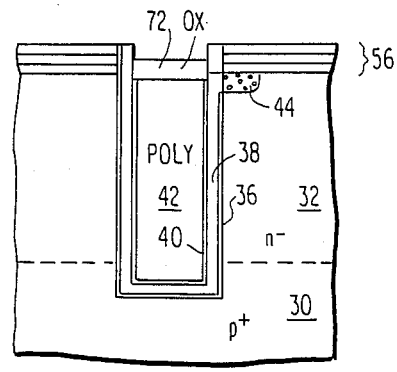
Figure 19:
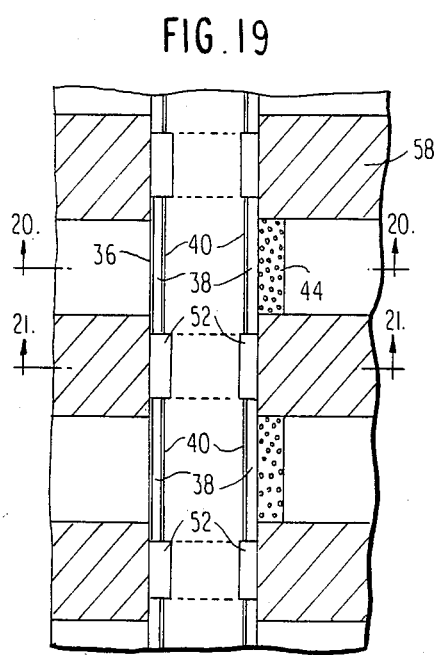
Figure 21:
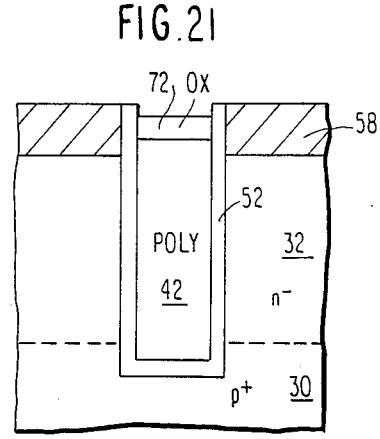

Thereafter, as illustrated in FIG. 19, 20 and 21, the inner dielectric layer 40 is formed with a structure and a process similar to that for the outer dielectric layer 36. The first oxide layer may be formed either by thermal oxidation or by CVD. The inner dielectric layer 40 does not need to be patterned. Portions in the isolation section will have no effect and are not illustrated and portions on the surface will be removed later. Then p+ polysilicon 42 is filled into the trench. The polysilicon may be applied without patterning since its deposition is followed by a chemical-mechanical etch, of the type previously described, so as to removed all polysilicon on the surface. Thereafter, the polysilicon 42 exposed in the trench is thermally oxidized to form an oxide cap 72 of about 100–150 nm thickness. The oxide cap 72 should extend to the area of the p+ buried contact 44 but should leave part of the p+ buried contact 44 facing the polysilicon 42 in order to prevent the polysilicon layer 38 from being oxidized beyond its contact to the p+ buried contact 44. An RIE etch is performed on the polysilicon 42 prior to the thermal oxidation of the oxide cap 72 to recess the top of the oxide cap 72 to approximately the top of the p+ buried contact 44, that is, about 100 nm. It is to be noted that all the oxidation steps have been causing the ROX stripes 58 to grow in thickness until they reach a thickness of about 0.5 micrometer.

Returning to FIGS. 3–5, the ox/nitride/ox mask 56 is then removed. A gate oxide 73 is then thermally grown to a thickness of about 15 nm so that it extends between the p+ surface regions 44 and 50. The polysilicon gate 34 is then CVD deposited and defined by photolithographic patterning and the p+ region 50 is formed by ion implantation. An activation anneal is required to activate the p+ region which tends to diffuse the p-type dopant beneath the gate region of the polysilicon gate 34. To avoid this, sidewall spacers can be formed on either side of the polysilicon gate prior to implantation. The spacers are formed by depositing silicon dioxide on the surface and then performing a directional RIE, as is well known.

BPSG (borophosphosilicate glass) 72 is then deposited and reflowed to uniformly cover the surface. Contact holes to the two p+ surface regions 46 and 50 are etched in the BPSG 72 and any underlying oxide by a photolithographic process and a patterned metal is deposited to form the bit line 48.

The above process completes the important parts of the fabrication of the charge gain memory cell of the invention. The configuration of the peripheral circuitry can be based on that of U.S. Pat. No. 3,387,286 to Dennard.

A second embodiment of the charge gain memory cell of the invention is illustrated in FIG. 22 and affords even greater density although at the cost of somewhat more difficult fabrication. In this device, the trenches are formed as interdigitated, cross-shaped trenches 80 having an axial section and opposing cross arm sections. Two polysilicon read word lines 82 and 84 fill opposing side walls of the axial section of the trench 80 without touching each other and completely fill the corresponding cross arm sections so as to reduce resistance. The remainder of the trench 80 is filled with an insulator. The two read word lines 82 and 84 are isolated from each other by the trench filling insulator so that they can be operated independently. The present inventor has disclosed how to form such isolated polysilicon layers in a trench in a technical article entitled "Self-aligned U-groove Gates for Field-effect Transistors" appearing in the IBM Technical Disclosure Bulletin, Vol. 22, no. 10, March 1980 at pages 4448 and 4449. The process consists of depositing a conformal layer of polysilicon and then performing a directional RIE etch so as to remove the polysilicon at the bottom of the axial section of the trench 80. Thereafter, the rest of the trench is filled with BPSG.

Polysilicon node layers 86 are formed around each of the corners where the axial section of the trench 80 meets fill opposing sidewalls, The polysilicon node layers 86 correspond to the polysilicon layer 38 and the inner and outer dielectric layers 36 and 40 of the first embodiment. The polysilicon node layers 86 are formed as in the first embodiment except that the polysilicon layer thereof does not extend completely across the trench 80. The intervals in the axial section of the trench 80 between the polysilicon node layers are isolated with a 100 nm thick oxide 88. Similarly, the distal ends of the side arms of the trench are isolated with a 100 nm thick oxide 90. A buried contact 92 is made to the end of the polysilicon node layer 86 in the same manner as was done for the buried contact hole 62. Dopants from the polysilicon node layer 86 thereby form a contact region which, together with one of parallel polysilicon write word lines 94 and a bit line contact 96 to an underlying doped region, form the write transistor. Overlying horizontal metal bit lines connect rows of the bit line contacts 96. It is, however, important, to form a thick oxide 98 beneath the polysilicon node layer 86 in the area of the word line 94 in order to isolate the node. The process of forming the selectively thicker sidewall portion of silicon oxide has been disclosed in the previously cited technical article by Mashiko et al. Much of the isolation between memory cells in the axial direction is performed by the side arms of the trenches 80 but a ROX region 100 is required in the remaining area. The vertical read transistor is formed at the distal ends of the side arms of the trench 80, with the source and drains being the substrate and the doped region beneath the bit line contact 96 and with the gate electrode and gate insulator being provided by the polysilicon node layer 86. The isolation transistor is formed in the axial portion of the trench 80 beneath the buried contact 92. The structure of the isolation region of the trench remains much the same as in the first embodiment.

The charge gain cell of FIG. 22 has several advantages. A single cell can be fit into an area of two features by two features, that is, a very high density. Furthermore, only a single bit line contact 96 is required for two cells, which is only one-half of the requirement of the first embodiment. This very high density is achieved with only slight increases in complexity of the fabrication. Almost all of the steps can be directly adapted from those described for the first embodiment.

What is claimed is:

1. A gain memory cell device, comprising:
   a lower region of a high doping concentration of a first conductivity type;
   a first surface region of a low doping concentration of a second conductivity type formed over said lower region;
   a trench having a bottom and substantially vertical sidewalls, formed into said first surface region, and extending downward to at least contact said lower region;

a nodal layer formed on at least one sidewall of said trench and comprising a first insulating layer facing said first surface region, a first conductive layer facing said first insulating layer and a second insulating layer facing said first conductive layer;

a second conductive layer formed in said trench whereby a signal capacitance is formed between said second conductive layer and said first conductive layer;

a second surface region of a high doping concentration of said first conductivity type formed in a surface region of said first surface region adjacent said first insulating layer and electrically connected to said first conductive layer;

a third surface region of a high doping concentration of said first conductivity type formed in a surface region of said first surface region adjacent said first insulating layer and separated from said second surface region, said third surface region being electrically isolated from said first conductive layer, with said lower region, third surface region and first conductive layer collectively forming a transistor with one of said lower region and third surface region forming a source, the other of said lower region and third surface region forming a drain, and said first conductive layer forming a gate electrode;

a fourth surface region of a high doping concentration of said first conductivity type formed in a surface region of said first surface region separated from said first conductive layer by said second surface region and by another portion of said first surface region;

a gate electrode formed over said first surface region in an area of said another portion between said second and fourth surface regions.

2. A gain memory cell device as recited in claim 1, wherein said third and fourth surface regions are on opposite sides of said trench.

3. A gain memory cell is recited in claim 2, further comprising a metal interconnect connecting said third and fourth surface regions.

4. A gain memory cell device as recited in claim 1, wherein said third and fourth surface regions are continuous on a same side of said trench.

5. A gain memory cell as recited in claim 4, wherein said trench has a first portion and a second portion orthogonal thereto and said nodal layer is formed on sidewalls of both said first and second portions, said second surface region being formed adjacent said first portion and said third and fourth surface regions being formed adjacent said second portion.

6. A gain memory cell array as recited in claim 5, wherein two said second conductive layers are formed on opposing lateral sides of said first portion of said trench and two said nodal layers are formed on opposing lateral sides of said second portion of said trench.

7. A gain memory cell as recited in claim 2, wherein said doping concentration of said first surface region increases away from an upper surface thereof.

8. A two-device dynamic RAM cell disposed on a portion of a silicon substrate of a first conductivity type having a well region of a second conductivity type formed therein, comprising:

a horizontal first FET device formed on a surface of the substrate, said first FET device having source and drain regions defined by first and second diffusion regions, respectively, of said first conductivity type, and having a gate electrode defined by a conductive structure overlying a portion of the substrate between said first and second diffusion regions;

a storage capacitor charge plate formed within a trench etched into a portion of said surface of the substrate adjacent to said first diffusion region of said first FET device and extending through said well to the substrate, said trench having sidewalls and a bottom that are coated by at least a first dielectric layer and at least a first conductive layer overlying said first dielectric layer, said first conductive layer being electrically coupled to said first diffusion region; and a vertical second FET device formed on one of said sidewalls of said trench, said second FET device having a source region defined by a third diffusion region of said first conductivity type abutting said trench and electrically isolated from said first conductive layer, a drain region defined by the substrate and a gate electrode defined by said first conductive layer within said trench.

* * * * *